(12) United States Patent
Kabuo

(10) Patent No.: US 7,114,139 B2
(45) Date of Patent: Sep. 26, 2006

(54) DEVICE AND METHOD FOR FLOORPLANNING SEMICONDUCTOR INTEGRATED CIRCUIT

(75) Inventor: Chie Kabuo, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 155 days.

(21) Appl. No.: 10/984,861

(22) Filed: Nov. 10, 2004

(65) Prior Publication Data

US 2005/0108668 A1     May 19, 2005

(30) Foreign Application Priority Data

Nov. 18, 2003   (JP) .............................. 2003-387825

(51) Int. Cl.
*G06F 17/50*   (2006.01)
(52) U.S. Cl. ............................... 716/6; 716/10; 716/12
(58) Field of Classification Search .................... 716/2, 716/6, 10, 12, 18
See application file for complete search history.

(56) References Cited

U.S. PATENT DOCUMENTS 6,038,691 A * 3/2000 Nakao et al. ............... 714/733
6,658,628 B1 * 12/2003 Landy et al. ................... 716/6
6,684,374 B1    1/2004 Ito et al.

FOREIGN PATENT DOCUMENTS

| JP | 2000-200835 A | 7/2000 |
|---|---|---|
| JP | 2000-339364 A | 12/2000 |

\* cited by examiner

*Primary Examiner*—Thuan Do
(74) *Attorney, Agent, or Firm*—McDermott Will & Emery LLP

(57) ABSTRACT

A plurality of blocks are optimally placed within a short process time while minimizing the exceeding of the delay time. Input means receives information on a logic circuit having a hierarchical structure including a plurality of blocks, and RTL estimation means calculates a delay time in the blocks in advance. Path detection means detects a timing path extending via a plurality of blocks, and delay calculation means calculates a delay value while assuming that the inter-block interconnect length is zero. Delay margin setting means sets a delay margin obtained by subtracting the delay value from a predetermined delay time. The delay margin forms a part of an objective function as a weight on the virtual interconnect length between each of the inter-block terminal pairs in the placement process, and the blocks are automatically placed by using the objective function.

9 Claims, 6 Drawing Sheets

DEVICE AND METHOD FOR FLOORPLANNING SEMICONDUCTOR INTEGRATED CIRCUIT

CROSS REFERENCE TO RELATED APPLICATION

This application claims priority under 35 U.S.C. §119 on patent application Ser. No. 2003-387825 filed in Japan on Nov. 18, 2003, the entire contents of which are hereby incorporated by reference.

BACKGROUND OF THE INVENTION

The present invention relates to a floorplanning device and a floorplanning method for a semiconductor integrated circuit for determining a placement of blocks based on delays along timing paths between the blocks.

In recent years, LSI designs have been more and more complicated along with the increase in the scale of integrated circuits, as in "system LSIs", and the miniaturization in the semiconductor process rules.

In the place-and-route phase of the LSI design process, the entire design is in some cases optimized in a "flat" manner or non-hierarchically or, in other cases, the entire design is divided into a plurality of circuit portions called "blocks" and optimized block by block or hierarchically. With the former method, since the entire design is optimized as a whole, a smaller circuit area is more likely to be achieved and the timing convergence is high. However, the process time is longer, and when a change is made to the circuit design, the whole optimization process need to be performed again. With the latter method, processes for different blocks can be run in parallel, thereby shortening the overall process time, and when a change is made to the circuit design, it is not necessary to perform the whole optimization process again. However, the timing convergence between blocks is poor, and the circuit area is likely to be larger.

When designing a system LSI, it is often the case that different design teams work on different blocks, and IPs (Intellectual Properties) are used in many cases in order to increase the design efficiency. In such cases, the hierarchical place-and-route method is more effective.

In the hierarchical place-and-route method, floorplanning for determining the placement of blocks within a chip is performed before more detailed place-and-route process is performed. Floorplanning is very important to improve the timing convergence between blocks and to realize smaller circuit areas. As the feature size is becoming so small that the interconnect delay is no longer negligible, it is becoming common to perform floorplanning as early as in the logic design phase or the RTL (register transfer level) design phase.

The placement of blocks in a floorplan can be determined by referring to the specifications of the LSI, or the blocks can be placed automatically by a floorplanning tool while visually checking the interconnections displayed by the graphic user interface (GUI) of the floorplanning tool.

FIG. 10 shows a flow chart of a conventional floorplanning method in which blocks are placed automatically taking timing into consideration. Based on the interconnect length for the inter-terminal connection in the initial placement (step 1000), the delay along the timing path is calculated in the path delay calculation step (step 1001). The obtained result is evaluated in the convergence determination step (step 1002) based on an evaluation formula for improving portions where a predetermined delay time is exceeded. If the evaluation formula does not converge, blocks are moved around in the placement changing step (step 1003), and the delay calculation is performed again for the new interconnect length after the change of the coordinates of the blocks. This is repeated until the evaluation formula converges.

In another conventional approach, as disclosed in Japanese Laid-Open Patent Publication No. 2000-339364 (page 7, FIG. 2), blocks having a larger number of paths therebetween for which a predetermined delay time is exceeded are placed adjacent to each other preferentially, based on the interconnect length calculated by using statistical interconnect length data without repeatedly performing the placement process and the delay calculation process.

Where the placement is manually determined, it is common to determine the placement while referring to the number of inter-block connections, which is displayed to the user. In another conventional approach, as disclosed in Japanese Laid-Open Patent Publication No. 2000-200835 (page 8, FIG. 2), for example, the direction in which a block is to be moved is determined and displayed to the user by analyzing changes in the interconnect delay while virtually moving the block around.

With a common conventional floorplanning device and method as shown in FIG. 10, the process time is long because it is necessary to repeat the delay calculation every time a block is moved.

With a conventional floorplanning device and method as disclosed in Japanese Laid-Open Patent Publication No. 2000-339364, the inter-block interconnect delay is obtained based on statistical interconnect length data, whereby there may be an error in the actual inter-block interconnect length after the actual place-and-route process. If the inter-block interconnect length, which is significantly dependent on the floorplan, contains an error, the error will degrade the quality of automatic placement.

With a conventional floorplanning device that displays the number of inter-block connections, based on which the user determines which blocks should be placed adjacent to each other preferentially, the displayed information does not include timing-related information, whereby it is difficult to find blocks that need to be adjacent to each other for a timing-related reason from among all the blocks that should be adjacent to each other. Therefore, after the placement is once determined, it is necessary to review the placement based on the results of a timing analysis.

With a conventional floorplanning device and method as disclosed in Japanese Laid-Open Patent Publication No. 2000-200835, the interconnect delay needs to be evaluated every time a block is moved for an improvement, whereby the process time increases in proportion to the number of nets.

SUMMARY OF THE INVENTION

It is therefore an object of the present invention to provide a floorplanning device and a floorplanning method for optimally placing blocks, in which it is not necessary to review the placement from a timing point of view after the place-and-route process and it is not necessary to perform the re-evaluation process, which would otherwise be necessary every time a block is moved for improving the delay, whereby the exceeding of the delay time is minimized within a short process time.

In order to achieve the object set forth above, in the present invention, a delay margin is set through a comparison with a design limit value based on a delay value, which is obtained in a manner independent of the placement of blocks while assuming the inter-block interconnect length is zero, thereby eliminating the need for recalculation of the delay when a change is made to the placement. Moreover, the delay is estimated taking into consideration the timing at the RTL design phase, thereby eliminating the need to later change the once-determined placement based on the results of a timing analysis after the placement is determined.

Specifically, a device of the present invention is a device for floorplanning a semiconductor integrated circuit for determining a placement of blocks, being circuit portions, when performing a place-and-route process in a hierarchical manner, including: input means for receiving information on a design of a logic circuit and information on devices forming the logic circuit; path detection means for detecting a timing path extending via more than one of the blocks based on the design information and device information received through the input means; delay calculation means for calculating a delay value of the detected timing path while assuming that an interconnect length between the blocks is zero; and delay margin setting means for setting a delay margin with respect to a delay time determined from a first point of view for terminal pairs of inter-block connections between input terminals and output terminals of the blocks based on the delay value calculated by the delay calculation means.

In one embodiment, the device further includes automated placement means for placing the blocks by using an objective function for controlling how much weight is put on a virtual interconnect length for each of the terminal pairs in an automated placement process, the objective function including the delay margin and the virtual interconnect length during a placement process.

In one embodiment, the device further includes buffer insertion means which, for a timing path for which a difference between the delay value and a delay time determined from the first point of view is less than or equal to a threshold value determined from a second point of view, inserts a buffer according to a load capacitance of the inter-block connection.

In one embodiment, the device further includes RTL estimation means which, for a register transfer level block included in the logic circuit whose information has been received through the input means, estimates a delay value between a terminal and a register in the block and a delay value between two terminals in the block so that the estimated values are smallest possible values.

In one embodiment, the device further includes display means which, for any two of the blocks, displays the total number of connections between the blocks and the number of connections therebetween for which the delay margin is less than or equal to a specified value.

In one embodiment, the display means displays a line between each of the terminal pairs which is color-coded based on the delay margin into one of a few delay margin levels.

A method of the present invention is a method for floorplanning a semiconductor integrated circuit for determining a placement of blocks, being circuit portions, when performing a place-and-route process in a hierarchical manner, including the steps of: inputting information on a design of a logic circuit and information on devices forming the logic circuit; detecting a timing path extending via more than one of the blocks based on the input design information and device information; calculating a delay value of the detected timing path while assuming that an interconnect length between the blocks is zero; setting a delay margin with respect to a delay time determined from a first point of view for terminal pairs of inter-block connections between input terminals and output terminals of the blocks based on the calculated delay value; and placing the blocks by using an objective function for controlling how much weight is put on a virtual interconnect length for each of the terminal pairs, the objective function including the delay margin and the virtual interconnect length during a placement process.

In one embodiment, the method further includes a step of, for a timing path for which a difference between the delay value and a delay time determined from the first point of view is less than or equal to a threshold value determined from a second point of view, inserting a buffer according to a load capacitance of the inter-block connection.

In one embodiment, the method further includes a step of, for a register transfer level block included in the logic circuit whose information has been input in the inputting step, estimating a delay value between a terminal and a register in the block and a delay value between two terminals in the block so that the estimated values are smallest possible values.

Thus, according to the present invention, the delay time within a block is calculated for each timing path while assuming that the inter-block interconnect length is zero before determining the inter-block interconnect length, whereby the delay margin is expressed in a form independent of the placement. This eliminates the need for recalculation of the delay when a change is made to the placement, whereby it is possible to obtain an optimal block placement in a short time.

According to the present invention, in a case where the delay time between blocks on a timing path is exceeded because the external load capacitance has been set to be too small in the block logic design process, i.e., because the delay time has been underestimated in the design process, a comparison is made with a threshold value predetermined based on information other than the logic design to detect the external load being large, in which case a buffer can be inserted as a countermeasure, thus easily improving the delay time being exceeded and obtaining an optimal block placement while improving the block placement precision.

According to the present invention, a block placement is determined taking into consideration the timing at the register transfer level design phase, whereby no timing shift occurs after the inter-block interconnect length is determined thereafter, thus eliminating the need to later change the placement after a timing analysis.

According to the present invention, the user can visually check the total number of inter-block connections and the number of inter-block connections for which only a small interconnect delay margin is left, thus facilitating the manual block placement process.

According to the present invention, the delay margin for each inter-block interconnect is color-coded into one of a few delay margin levels, whereby the user can visually check the margin level, thus facilitating the manual block placement process.

DETAILED DESCRIPTION OF THE INVENTION

First Embodiment

Figure 1:
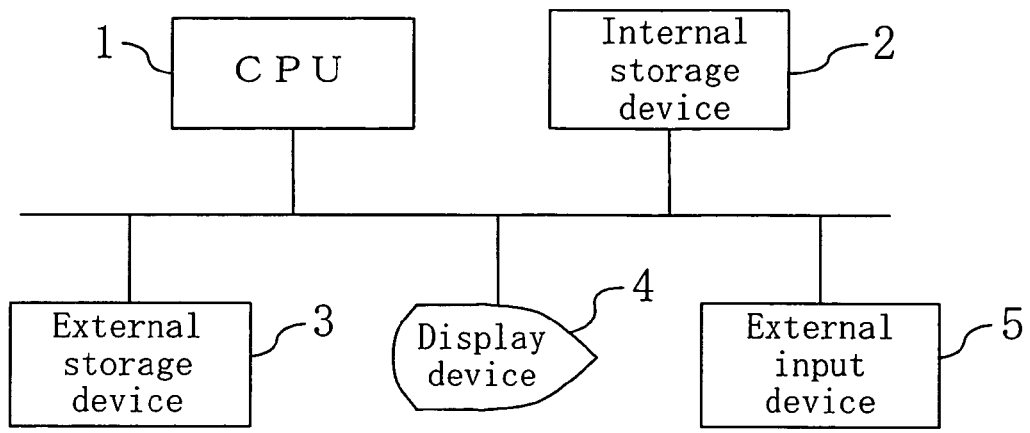
FIG. 1 shows a configuration of a device for floorplanning a semiconductor integrated circuit.

Embodiments of the present invention will now be described with reference to the drawings. FIG. 1 shows a general configuration of a device for floorplanning a semiconductor integrated circuit according to an embodiment of the present invention.

Referring to FIG. 1, the device for floorplanning a semiconductor integrated circuit of the present invention includes a CPU 1 for providing an overall control of the floorplanning device, an internal storage device 2 such as a memory, an external storage device 3 such as a magnetic disk, a display device 4 such as a CRT, and an external input device 5 such as a keyboard and a mouse.

Various data including various programs and circuit information stored in the external storage device 3 are taken into the internal storage device 2, and the programs are executed to process various data, the results of which are stored in the internal storage device 2 or the external storage device 3. The display device 4 displays image data produced by the CPU 1. The external input device 5 receives inputs from the user, and the information input is passed to the CPU 1. As the CPU 1 receives the information input by the user, the CPU 1 starts the execution of the various programs. The present embodiment is directed to a device and method for floorplanning a semiconductor integrated circuit in which the entire circuit is divided into a plurality of circuit portions called "blocks" so that the placement and routing of the blocks are optimized hierarchically.

Figure 2:
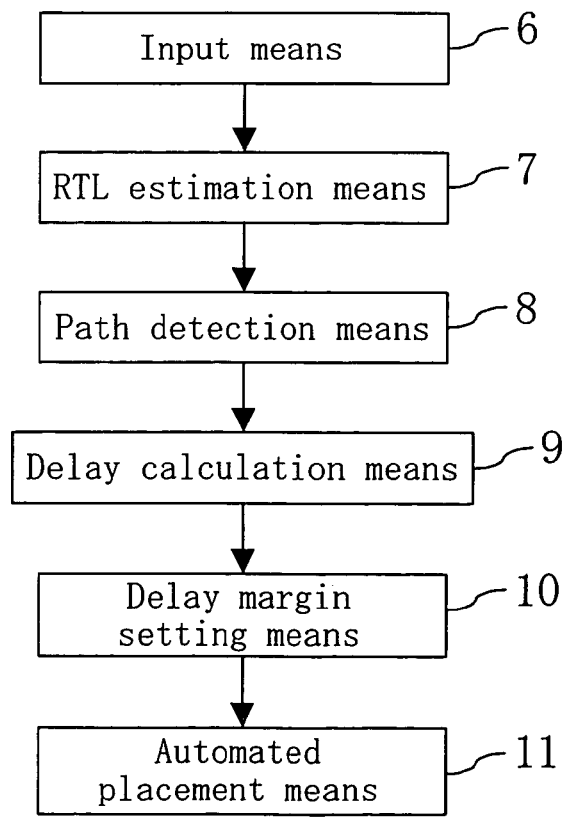
FIG. 2 shows a configuration of a device for floorplanning a semiconductor integrated circuit according to the first embodiment of the present invention.

FIG. 2 is a conceptual diagram showing a configuration of the CPU 1 of FIG. 1.

In FIG. 2, reference numeral 6 denotes input means for receiving information on the design of a logic circuit and information on devices forming the logic circuit; reference numeral 7 denotes RTL estimation means which, for a register transfer level block included in the logic circuit whose information has been received, estimates the delay value between a terminal and a register in the block and the delay value between a terminal and another terminal in the block so that the estimated values are smallest possible values taking into consideration the timing, etc.; reference numeral 8 denotes path detection means for detecting a timing path extending via a plurality of blocks based on the design information and device information received through the input means 6; reference numeral 9 denotes delay calculation means for calculating the delay value of the timing path assuming that the inter-block interconnect length is zero; reference numeral 10 denotes delay margin setting means for setting a delay margin with respect to a delay time which is predetermined (determined from the first point of view) based on the logic design for a terminal pair including an input terminal and an output terminal of an inter-block connection based on the calculated delay value; and reference numeral 11 denotes automated placement means for placing blocks.

Figure 3:
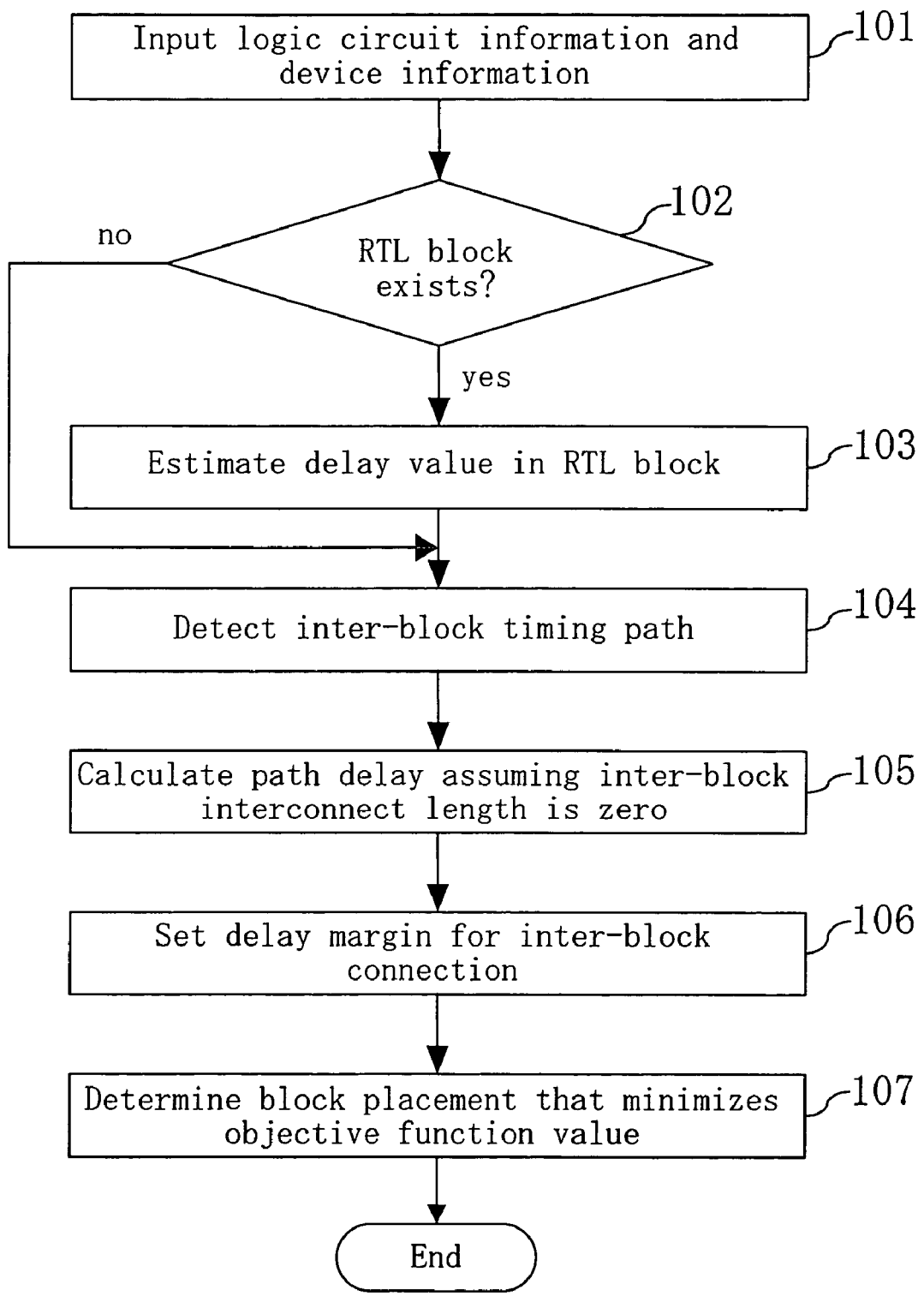
FIG. 3 is a flow chart of a method for floorplanning a semiconductor integrated circuit according to the first embodiment of the present invention.

FIG. 3 is a flow chart of a method for floorplanning a semiconductor integrated circuit according to the first embodiment of the present invention.

Referring to FIG. 3, in step 101, the design information and the operating speed information of a logic circuit having a hierarchical structure and the timing information and the physical information of devices forming the logic circuit are received through the input means 6. Each of the devices forming the logic circuit is either one of those provided as libraries such as standard cells or memories or a hierarchical block having a timing model. The input design information includes information on the connection between the devices and information on the register transfer level (hereinafter referred to as "RTL") function design.

Then, in step 102, it is determined whether or not an RTL block exists. If an RTL block exists, the delay value in the RTL block is estimated by the RTL estimation means 7 in the following step (step 103). If an RTL block does not exist, the process proceeds to step 104 while skipping step 103.

The configuration of a block for which the delay is estimated by the RTL estimation means 7 will now be described with reference to FIG. 4.

Figure 4:
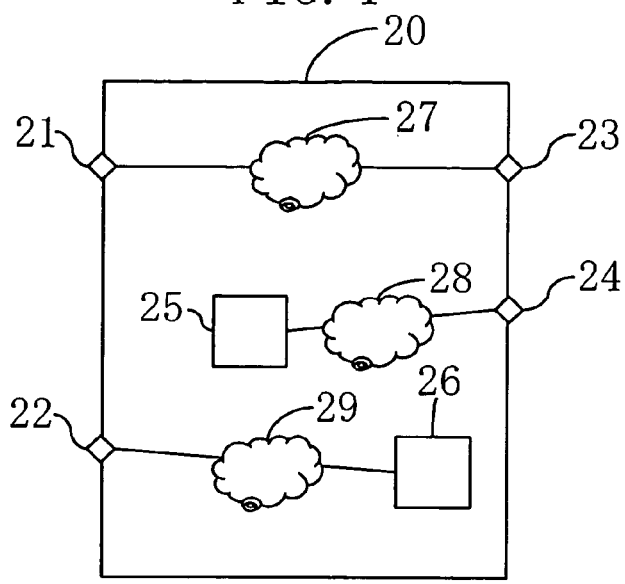
FIG. 4 shows portions where the delay is to be estimated by RTL estimation means.

In FIG. 4, reference numeral 20 denotes the outer shape of an RTL block, reference numerals 21 and 22 denote input terminals, reference numerals 23 and 24 denote output terminals, reference numerals 25 and 26 denote registers or latches, and reference numerals 27, 28 and 29 denote combination circuits. With such a configuration, the RTL estimation means 7 obtains the delay times for different paths in the RTL block: (1) the path from the input terminal 21 to the output terminal 23 via the combination circuit 27; (2) the path from the register or latch 25 to the output terminal 24 via the combination circuit 28; and (3) the path from the input terminal 22 to the register or latch 26 via the combination circuit 29.

In step 103, in a block as shown in FIG. 4, the input RTL design description is first parsed to extract the three paths between input and output terminals, and limitations are provided for the extracted circuit such that all the paths are synthesized with minimum delays, after which an ordinary logic synthesis process is performed.

Then, in step 104, the path detection means 8 detects a timing path extending via a plurality of blocks and I/O cells based on the connection information and the device timing information of the logic circuit.

Then, in step 105, the delay calculation means 9 obtains the delay value of the detected timing path. In this process, for connections between blocks and I/O cells, the delay value of the path is obtained while assuming that the interconnect length is zero, i.e., while assuming that the capacitance and the resistance are zero. Note that for interconnects in a block, the capacitance and the resistance are calculated based on the virtual interconnect length obtained from statistical data, as in the prior art.

Then, in step 106, the delay margin setting means 10 obtains a value by subtracting the delay value of the timing path from the delay value determined by the input operating speed information. The obtained difference will hereinafter be referred to as the "margin". Moreover, for a terminal pair including an input terminal and an output terminal of a connection between blocks or I/O cells, the minimum value of the margin of the timing path extending via the terminal pair is set as the delay margin for that terminal pair.

Then, in step 107, the automated placement means 11 uses an objective function including the delay margin and the virtual interconnect length for each terminal pair during the placement process to determine the placement of the block in such a manner that the value of the objective function is minimized. The virtual interconnect length is the Manhattan distance between a pair of terminals. The objective function is shown as Expression 1 below.

$$\text{Objective function} = \sum_{Terminal\ Pair} (\text{Virtual interconnect length} \times \alpha/\text{Delay margin}) \quad \text{Expression 1}$$

In Expression 1, $\alpha$ is a parameter with which the automated placement can be controlled as to how much weight is put on the delay or the interconnect length. For example, the value $\alpha$ can be set to 0.5 to put more weight on the delay or 1 to put more weight on the interconnect length. The optimization method using an objective function may be, for example, a simulated annealing method (SA method).

As described above, the present embodiment uses the delay calculation means 9 for obtaining the delay value independent of the placement by assuming that the inter-block interconnect length is zero and the delay margin setting means 10, whereby it is not necessary to recalculate the delay when the placement is changed, thus obtaining a block placement in a short time. Moreover, with the provision of the RTL estimation means 7, it is possible to obtain a block placement taking into consideration the timing at the RTL design phase.

Second Embodiment

Figure 5:
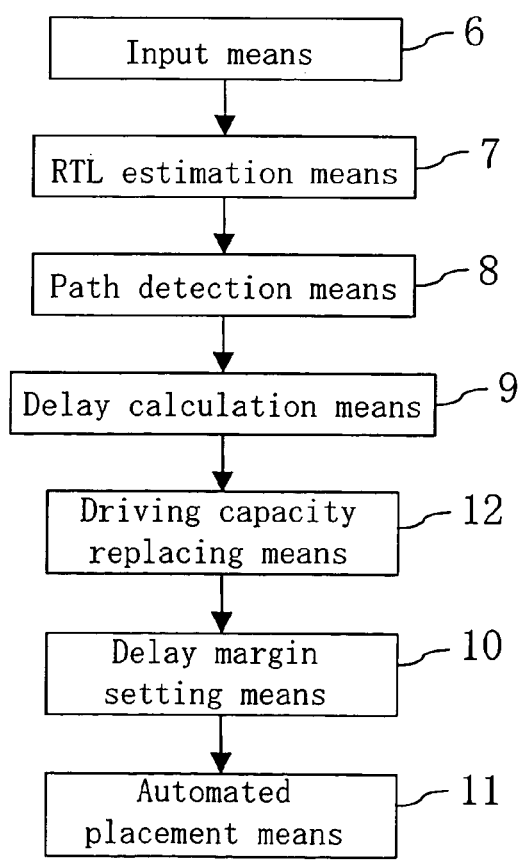
FIG. 5 shows a configuration of a device for floorplanning a semiconductor integrated circuit according to the second embodiment of the present invention.

FIG. 5 shows a configuration of a device for floorplanning a semiconductor integrated circuit according to the second embodiment of the present invention. The configuration of the present embodiment differs from that of the first embodiment shown in FIG. 2 in that a buffer insertion means 12 is provided following the delay calculation means 9.

Figure 6:
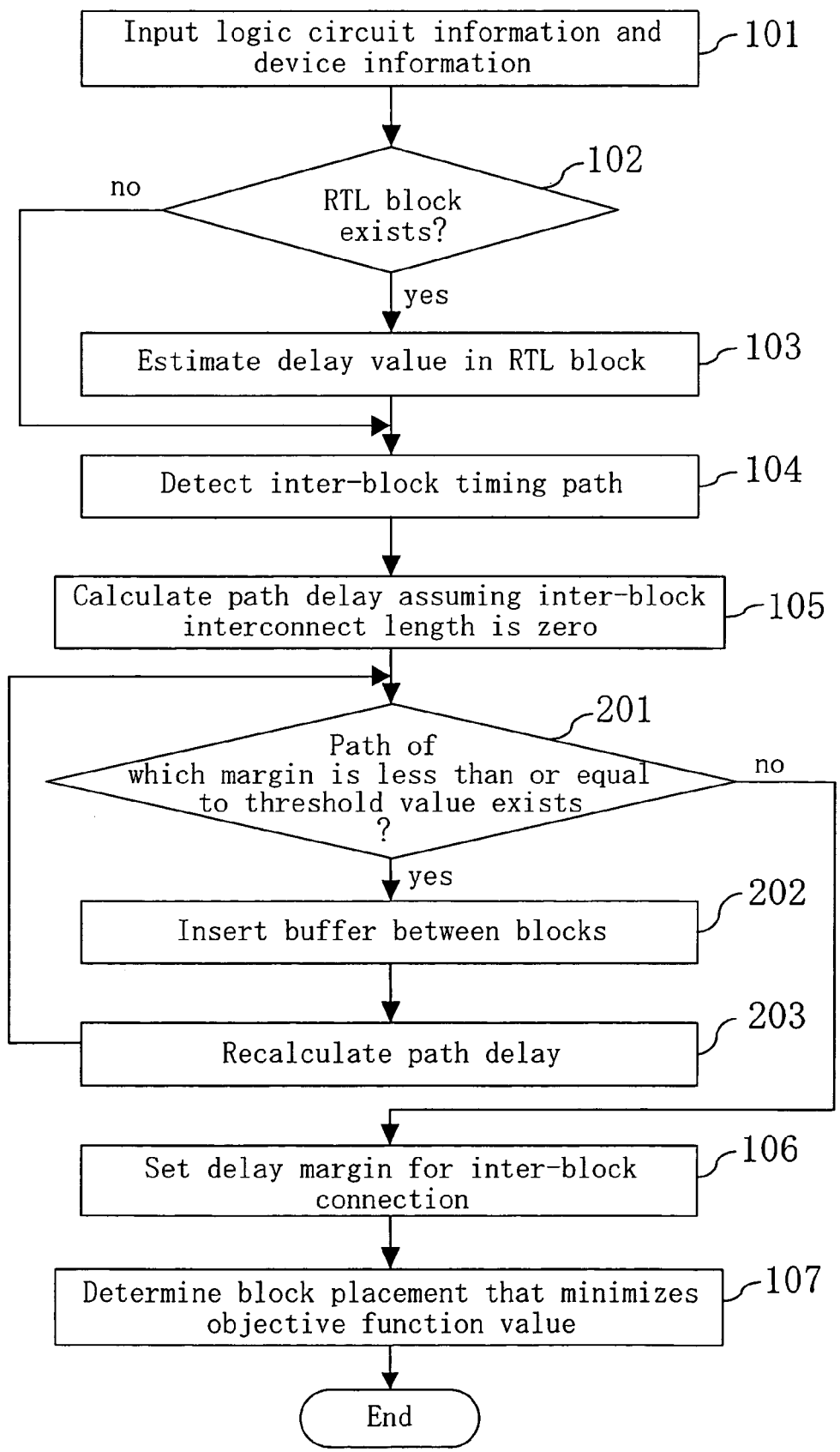
FIG. 6 is a flow chart of a method for floorplanning a semiconductor integrated circuit according to the second embodiment of the present invention.

FIG. 6 is a flow chart of a method for floorplanning a semiconductor integrated circuit according to the second embodiment of the present invention. The flow chart of the present embodiment differs from that of the first embodiment shown in FIG. 3 in that steps 201 to 203 are provided, as the operation of the buffer insertion means 12, between step 105 and step 106.

The operation of the buffer insertion means 12 will now be described with reference to FIG. 6.

The process from step 101 to step 105 is the same as that of the first embodiment.

First, in step 201, it is determined whether or not there is a path for which the margin, which is obtained by subtracting the path delay value calculated by the delay calculation means 9 from the delay time determined in the logic design process (determined from the first point of view), is less than or equal to a threshold value specified by the user (determined from the second point of view). The threshold value is an assumed minimum value of the delay time for an inter-block interconnect, and can be determined based on the manufacturing process. If such a path does not exist, the process proceeds to step 106. If such a path exists, the process proceeds to the following step (step 202), where a buffer is inserted outside a block of an output terminal based on the fanout (connection load capacitance) of the output terminal of the block on the path. Then, in step 203, the delay of the path is recalculated, and the process returns to step 201.

Note that the delay recalculation at step 203 yielding a negative margin indicates that it is necessary to reduce the number of stages of gates over a plurality of blocks, which requires measures such as logic optimization at block boundary portions, changes to how the entire design is divided into blocks and changes to the function design. In such a case, the process of the flow chart may be terminated.

As described above, the present embodiment uses the buffer insertion means 12, whereby an improvement can be made easily in a case where the delay time of an inter-block timing path is exceeded because the external load capacitance has been set to be too small in the block logic design process, thus obtaining an optimal block placement while improving the block placement precision.

Third Embodiment

Figure 7:
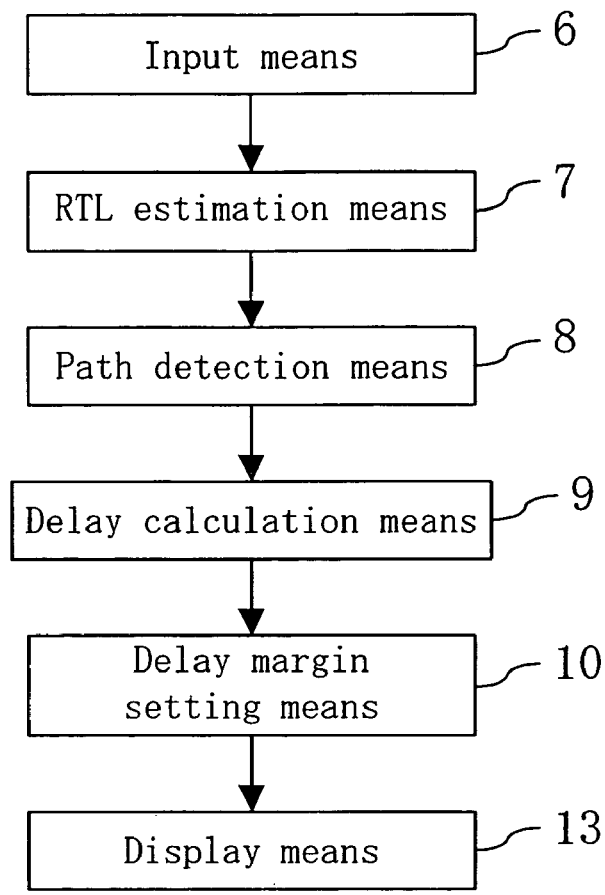
FIG. 7 shows a configuration of a device for floorplanning a semiconductor integrated circuit according to the third embodiment of the present invention.

FIG. 7 shows a configuration of a device for floorplanning a semiconductor integrated circuit according to the third embodiment of the present invention. The configuration of the present embodiment differs from that of the first embodiment shown in FIG. 2 in that display means 13 is provided instead of the automated placement means 11.

The display means 13 produces drawing data to be displayed on the display device 4 based on the value of the delay margin which has been set for each terminal pair.

Figure 8:
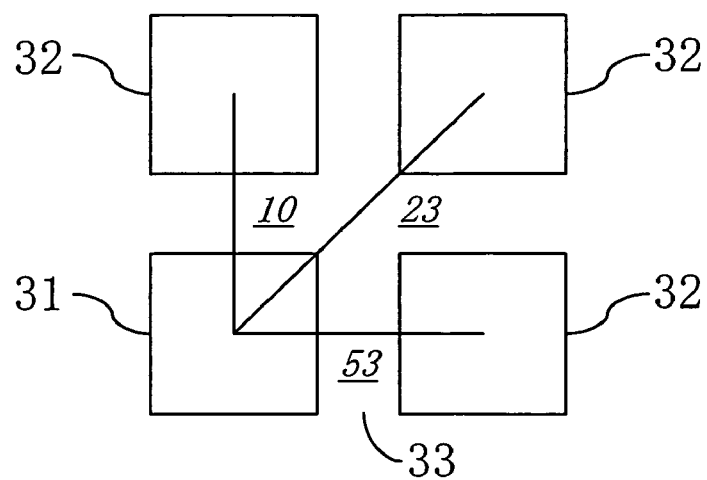
FIG. 8 shows a first example of display means according to the third embodiment of the present invention.
Figure 9:
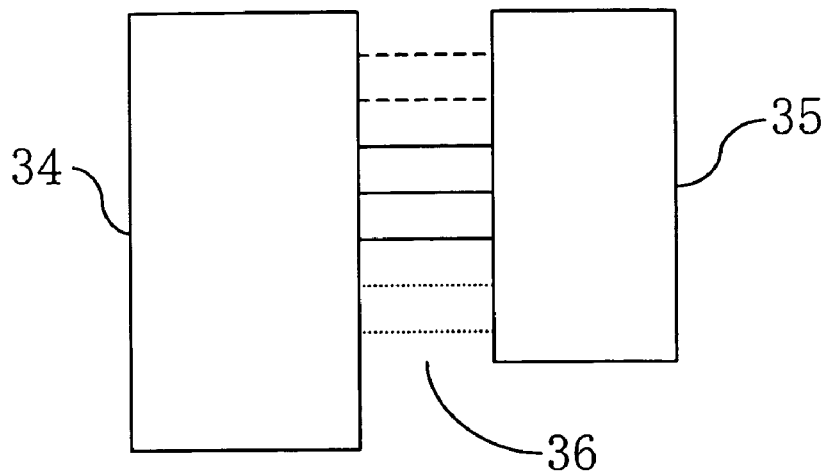
FIG. 9 shows a second example of display means according to the third embodiment of the present invention.
Figure 10:
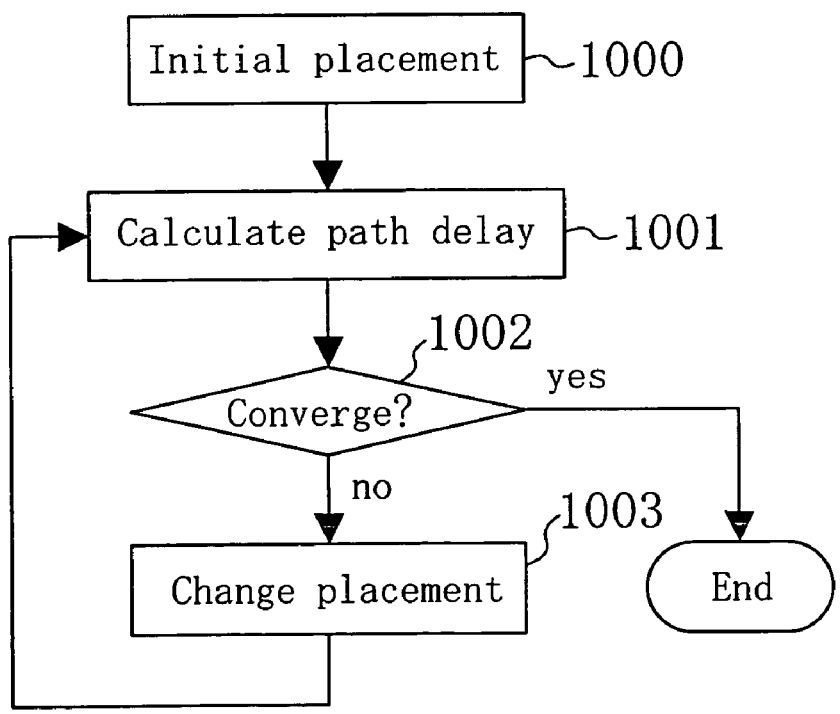
FIG. 10 is a flow chart of a conventional floorplanning method.

FIG. 8 and FIG. 9 are examples of screen images, which the display means 13 displays on the display device 4.

Referring to FIG. 8, reference numeral 31 denotes a block selected by the user via the external input device 5, reference numeral 32 denotes other blocks, and reference numeral 33 denotes the number of connections for which the delay margin is less than or equal to a specified value among all the inter-block connections. In the illustrated example, the block 31 selected by the user is connected to the other blocks 32 via 10, 23 and 53 connections, respectively, as indicated by the reference numeral 33.

Thus, the display means 13 produces drawing data for displaying, for any two blocks, the total number of connections therebetween and the number of those connections for which the delay margin is less than or equal to the specified value.

Referring to FIG. 9, reference numerals 34 and 35 denote blocks, and reference numeral 36 denotes inter-terminal connections (lines each connecting between a pair of terminals), which are color-coded based on the delay margin. In the illustrated example, the inter-terminal connections 36 between the blocks 34 and 35 are color-coded in three colors based on their delay margin values, which are classified into one of three delay margin levels. Note that FIG. 9 uses broken, solid and dotted lines, instead of three different colors, to represent the connections between terminals of different delay margin levels, as a matter of convenience.

Thus, in a case where block terminals are placed along the block periphery, the display means 13 produces drawing data in which the delay margin set for each terminal pair is color-coded into one of a few delay margin levels.

As described above, the present embodiment uses the display means 13, whereby the manual block placement is facilitated by allowing the user to visually check the delay margin for each inter-block interconnect.

What is claimed is:

1. A device for floorplanning a semiconductor integrated circuit for determining a placement of blocks, being circuit portions, when performing a place-and-route process in a hierarchical manner, comprising:
   input means for receiving information on a design of a logic circuit and information on devices forming the logic circuit;
   path detection means for detecting a timing path extending via more than one of the blocks based on the design information and device information received through the input means;
   delay calculation means for calculating a delay value of the detected timing path while assuming that an interconnect length between the blocks is zero; and
   delay margin setting means for setting a delay margin with respect to a delay time determined from a first point of view for terminal pairs of inter-block connections between input terminals and output terminals of the blocks based on the delay value calculated by the delay calculation means.

2. The device for floorplanning a semiconductor integrated circuit of claim 1, further comprising automated placement means for placing the blocks by using an objective function for controlling how much weight is put on a virtual interconnect length for each of the terminal pairs in an automated placement process, the objective function including the delay margin and the virtual interconnect length during a placement process.

3. The device for floorplanning a semiconductor integrated circuit of claim 1, further comprising buffer insertion means which, for a timing path for which a difference between the delay value and a delay time determined from the first point of view is less than or equal to a threshold value determined from a second point of view, inserts a buffer according to a load capacitance of the inter-block connection.

4. The device for floorplanning a semiconductor integrated circuit of claim 1, 2 or 3, further comprising RTL estimation means which, for a register transfer level block included in the logic circuit whose information has been received through the input means, estimates a delay value between a terminal and a register in the block and a delay value between two terminals in the block so that the estimated values are smallest possible values.

5. The device for floorplanning a semiconductor integrated circuit of claim 1, further comprising display means which, for any two of the blocks, displays the total number of connections between the blocks and the number of connections therebetween for which the delay margin is less than or equal to a specified value.

6. The device for floorplanning a semiconductor integrated circuit of claim 5, wherein the display means displays a line between each of the terminal pairs which is color-coded based on the delay margin into one of a few delay margin levels.

7. A method for floorplanning a semiconductor integrated circuit for determining a placement of blocks, being circuit portions, when performing a place-and-route process in a hierarchical manner, comprising the steps of:
   inputting information on a design of a logic circuit and information on devices forming the logic circuit;
   detecting a timing path extending via more than one of the blocks based on the input design information and device information;
   calculating a delay value of the detected timing path while assuming that an interconnect length between the blocks is zero;
   setting a delay margin with respect to a delay time determined from a first point of view for terminal pairs of inter-block connections between input terminals and output terminals of the blocks based on the calculated delay value; and
   placing the blocks by using an objective function for controlling how much weight is put on a virtual interconnect length for each of the terminal pairs, the objective function including the delay margin and the virtual interconnect length during a placement process.

8. The method for floorplanning a semiconductor integrated circuit of claim 7, further comprising a step of, for a timing path for which a difference between the delay value and a delay time determined from the first point of view is less than or equal to a threshold value determined from a second point of view, inserting a buffer according to a load capacitance of the inter-block connection.

9. The method for floorplanning a semiconductor integrated circuit of claim 7, further comprising a step of, for a register transfer level block included in the logic circuit whose information has been input in the inputting step, estimating a delay value between a terminal and a register in the block and a delay value between two terminals in the block so that the estimated values are smallest possible values.

* * * * *